US006791326B2

(12) United States Patent
Gerald, II et al.

(10) Patent No.: US 6,791,326 B2
(45) Date of Patent: Sep. 14, 2004

(54) NMR DETECTOR FOR SUPPORTED MONOLAYER AND MULTILAYER FILMS

(75) Inventors: Rex E. Gerald, II, Brookfield, IL (US); Lennox E. Iton, Downers Grove, IL (US); Jerome W. Rathke, Lockport, IL (US)

(73) Assignee: The University of Chicago

( * ) Notice: Subject to any disclaimer, the term of this patent is extended or adjusted under 35 U.S.C. 154(b) by 26 days.

(21) Appl. No.: 10/313,291

(22) Filed: Dec. 6, 2002

(65) Prior Publication Data

US 2003/0117141 A1 Jun. 26, 2003

Related U.S. Application Data

(60) Provisional application No. 60/337,833, filed on Dec. 7, 2001.

(51) Int. Cl.⁷ .................................................. G01V 3/00
(52) U.S. Cl. ...................................... 324/318; 324/322
(58) Field of Search ................................ 324/318–322, 324/307, 309, 300

(56) References Cited

U.S. PATENT DOCUMENTS

| | | | |
|---|---|---|---|
| 5,574,370 A | | 11/1996 | Woelk et al. |
| 5,696,449 A | * | 12/1997 | Boskamp ..................... 324/318 |
| 5,928,148 A | * | 7/1999 | Wang et al. ................. 600/420 |
| 5,939,962 A | * | 8/1999 | Tahara et al. ............... 335/216 |
| 6,046,592 A | | 4/2000 | Rathke et al. |
| 6,172,503 B1 | * | 1/2001 | Mori ........................... 324/318 |
| 6,191,583 B1 | | 2/2001 | Gerald, II et al. |
| 6,249,121 B1 | * | 6/2001 | Boskamp et al. ........... 324/318 |
| 6,297,636 B1 | * | 10/2001 | Shimo et al. ................ 324/318 |
| 6,320,383 B1 | * | 11/2001 | Kato et al. .................. 324/318 |
| 6,469,507 B1 | * | 10/2002 | Gerald et al. ............... 324/318 |
| 2002/0190717 A1 | * | 12/2002 | Leussler, et al. ............ 324/318 |
| 2003/0016019 A1 | * | 1/2003 | Gerald et al. ............... 324/322 |

* cited by examiner

Primary Examiner—Diego Gutierrez
Assistant Examiner—Dixomara Vargas
(74) Attorney, Agent, or Firm—Joan Pennington (57) ABSTRACT

A novel NMR detector of the present invention comprises a radio frequency (RF) resonance circuit. The RF resonance circuit includes a principal detector element and a sample chamber. The principal detector element defines an inductor of the electronic resonance circuit. In one embodiment of the invention the sample chamber containing the inductor is a stainless steel sample chamber. The stainless steel sample chamber is a modified toroid cavity detector (TCD). The inductor is formed by an atomically flat metallic disk, such as, a mercury pool, with a predefined surface area, such as a surface area of 7.5 cm². Liquid mercury is incorporated into a toroid cavity detector as the inductor of the resonance circuit, and as the base of the cavity. Self-assembled molecular structures (monolayers and multilayers) are formed using long-chain alkane thiols, which are known to chemically react with silver, gold, platinum, palladium, and mercury surfaces.

20 Claims, 8 Drawing Sheets

Hg-(*n*-dodecanethiolate)
(monolayer)

NMR DETECTOR FOR SUPPORTED MONOLAYER AND MULTILAYER FILMS

This application claims the benefit of U.S. Provisional Application No. 60/337,833 filed Dec. 7, 2001.

The United States Government has rights in this invention pursuant to Contract No. W-31-109-ENG-38 between the United States Government and Argonne National Laboratory.

FIELD OF THE INVENTION

The present invention relates to a novel NMR detector that allows the NMR spectra of self-assembled molecular monolayer and multilayer films, each prepared on a macroscopic and atomically flat metallic surface.

DESCRIPTION OF THE RELATED ART

Traditional scattering techniques, such as x-ray reflectivity experiments, only determine the thickness of monolayer and multilayer films and have not been able to specify details about the arrangement and motions of molecules that compose the films or of guest molecules that are embedded in the films.

The modification of metallic surfaces using organic films, which are composed of highly ordered molecular assemblies, is a technological development that parallels the semiconductor revolution. Applications for ordered molecular films of nanoscale thickness will prevail in numerous nanotech areas, including flat panel displays, highly selective biological sensors, paints and industrial coatings, and magnetic storage. X-ray and electron diffraction methods are used extensively to characterize the rigid and periodic atomic architecture of semiconductor materials. Several additional electron scattering techniques are used to investigate semiconductor multilayers used as electronic gates and switches. However, diffraction and scattering instruments are of limited use for investigations of the fluctuating molecular architecture and dynamics of self-assembled molecular films. Therefore, a new approach is needed for investigating the conformations and motions of the molecules that compose monolayer and multilayer nanoscale films.

Rod and disk shaped molecules that spontaneously self-assemble to form periodic or aperiodic two-dimensional structures are the building blocks for the new emerging technology of nanoscale coatings. The intermolecular interactions that bind molecules together to form thin films are significantly weaker than those that bind the atoms in semiconductor materials. The most significant consequence of these weaker intermolecular forces is the substantial vibrational, librational, and rotational mobility of the molecules. Traditional diffraction and scattering techniques only elucidate the thickness of monolayer and multilayer films, and have not been able to specify details about the arrangement and motions of molecules that compose the films or of guest molecules that are embedded in the films.

Nuclear magnetic resonance (NMR) analysis is a powerful method by which to determine chemical structures and to examine reaction dynamics in a diversity of chemical and biochemical systems.

For example, U.S. Pat. No. 5,574,370, issued Nov. 12, 1996 to Woelk et al., discloses a toroid cavity detection (TCD) system for determining the spectral properties and distance from a fixed axis for a sample using Nuclear Magnetic Resonance. The detection system consists of a toroid with a central conductor oriented along the main axis of the toroidal cylinder and parallel to a static uniform magnetic field, $B_0$. An RF signal is applied to the central conductor to produce a magnetic field $B_1$ perpendicular to the central axis of the toroid and whose field strength varies as the inverse of the radius of the toroid. The toroid cavity detection system can be used to encapsulate a sample, or the detection system can be perforated to allow a sample to flow into the detection device or to place the samples in specified sample tubes. The central conductor can also be coated to determine the spectral property of the coating and the coating thickness. The sample is then subjected to the respective magnetic fields and the responses measured to determine the desired properties.

U.S. Pat. No. 6,046,592, issued Apr. 4, 2000 to Rathke et al., discloses a near-electrode imager for employing nuclear magnetic resonance imaging to provide in situ measurements of electrochemical properties of a sample as a function of distance from a working electrode. The near-electrode imager uses the radio frequency field gradient within a cylindrical toroid cavity resonator to provide high-resolution nuclear magnetic resonance spectral information on electrolyte materials.

U.S. Pat. No. 6,191,583, issued Feb. 20, 2001 to Gerald II, et al. discloses a toroid cavity detector that includes an outer cylindrical housing through which extends a wire along the central axis of the cylindrical housing from a closed bottom portion to the closed top end of the cylindrical housing. In order to analyze a sample placed in the housing, the housing is placed in an externally applied static main homogeneous magnetic field ($B_0$). An RF current pulse is supplied through the wire such that an alternately energized and de-energized magnetic field ($B_1$) is produced in the toroid cavity. The $B_1$ field is oriented perpendicular to the $B_0$ field. Following the RF current pulse, the response of the sample to the applied $B_0$ field is detected and analyzed. In order to minimize the detrimental effect of probe ringing, the cylindrically shaped housing is elongated sufficiently in length so that the top and bottom portions are located in weaker, fringe areas of the static main magnetic $B_0$ field. In addition, a material that tends to lessen the effect of probe ringing is positioned along the top and bottom ends of the toroid cavity. In another embodiment, a plug is positioned adjacent the inside of the top and bottom ends of the toroid cavity so that the sample contained in the toroid cavity is maintained in the strongest and most homogeneous region of the static magnetic $B_0$ field.

U.S. Pat. No. 6,469,507, issued Oct. 22, 2002 to Gerald II, et al. discloses imaging apparatus used in a toroid cavity detector for nuclear magnetic resonance (NMR) analysis to hold samples relative to a principal detector element which is a flat metal conductor, the plane of which is parallel to the longitudinal axis of the toroid cavity. A sample is held adjacent to or in contact with the principal detector element so that the sample can be subjected to NMR analysis when a static main homogeneous magnetic field ($B_0$) produced by a NMR magnetic device is applied to the toroid cavity and an RF excitation signal pulse is supplied to the principal detector element so that an alternately energized and de-energized magnetic field ($B_1$) is produced in the sample and through the toroid cavity. The sample may be components of a coin cell battery which are mounted within the toroid cavity relative to the principal detector element by an non-conductive coin cell battery imager or a press assembly so that the components are hermetically sealed together and so that a direct current (DC) potential can be applied to the components. Alternatively, a sample is positioned within an O-ring maintained relative to the principal detector element by a pair of glass plates that are disposed on opposite sides of the principal detector element and are compressed toward each other so that NMR analysis can be used to analyze the sample with light transmitted through the sample or to analyze a sample separated from the principal detector element by semi-permeable membranes.

The subject matter of each of the U.S. Pat. Nos. 5,574,370, 6,046,592, 6,191,583, and 6,469,507 is incorporated herein by reference.

A principal object of the present invention is to provide a novel NMR detector that allows the NMR spectra of self-assembled molecular monolayer and multilayer films, each prepared on a macroscopic and atomically flat metallic surface.

SUMMARY OF THE INVENTION

In brief, the novel NMR detector of the present invention comprises a radio frequency (RF) resonance circuit. The RF resonance circuit includes a principal detector element and a sample chamber. The principal detector element defines an inductor of the electronic resonance circuit.

In one embodiment of the invention the sample chamber containing the inductor is a stainless steel sample chamber. The stainless steel sample chamber is a modified toroid cavity detector (TCD).

In accordance with features of the invention, the inductor is formed by an atomically flat metallic disk, such as, a mercury pool, with a predefined surface area, such as a surface area of 7.5 $cm^2$. Liquid mercury is incorporated into a toroid cavity detector as the inductor of the resonance circuit, and as the base of the cavity.

Self-assembled molecular structures (monolayers and multilayers) are formed using long-chain alkane thiols, which are known to chemically react with silver, gold, platinum, and mercury surfaces. The NMR spectra of the alkane chain protons reveal an anomalous chemical shift of −4.1 ppm for the methylene protons, which typically resonate at +1.25 ppm in isotropic solutions. In addition, rotating frame images confirm that the NMR signal originates only from the surface of the metallic substrate. Imaging results also indicate that the bound mercury alkane thiolate monolayer may impart molecular order in a liquid phase composed of excess neat alkane thiol and located directly above the monolayer film. These experiments represent the first NMR spectroscopy data on supported highly ordered nanothick films of macroscopic dimensions, and demonstrate that the novel NMR detector is functional.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Having reference now to the drawings, a novel NMR detector 100 of the invention takes advantage of high NMR sensitivity at the metal surface of the inductor in a radio frequency circuit. NMR detector 100 advantageously is used to record NMR spectra of oriented monolayer films with macroscopic lateral dimensions (>1 cm) formed on electrode surfaces. The NMR detector 100 has sufficient signal sensitivity to investigate oriented polymer electrolyte films formed in situ on electrode surfaces. The in situ synthesis and surface NMR investigations of ion-conducting monolayers may lead to self-assembled nanoscale electrode surfaces that are passivated with oriented lithium-channeling poly(ethylene oxide) films.

In accordance with features of the invention, NMR detector 100 makes possible NMR spectroscopy investigations of monolayer and multilayer thin films. The NMR data obtainable from NMR detector 100 is unique because it will specify the architecture and dynamics of the molecules that compose the films.

Enhanced signal sensitivity for samples that are in direct contact with the principal detector element of a coin cell battery imager has been observed. NMR detector 100 takes advantage of this high surface sensitivity. Several n-alkyl thiols have been deposited on an atomically flat surface 102 of NMR detector 100, and self-assembled to form metal-thiolate monolayers. Anomalous chemical shifts in $^1$H NMR spectra and images have revealed the orientation and dynamics of the molecules that passivate the electrode surface 102.

For the first time, investigation by nuclear magnetic resonance of the molecular architecture and dynamics of macroscopic self-assembled monolayers and thin films of normal alkanethiolates on atomically flat mercury surfaces is enabled by the NMR detector 100. NMR spectroscopy provides a sensitive probe of molecular order by recording single-quantum transitions by nuclear spins that are modified by anisotropic interactions, including: (a) internuclear magnetic dipole-dipole and (b) electronic nuclear shielding. NMR imaging methods employing radio frequency gradients at the surface of a mercury pool (used as the inductor) produced images of a layered structure. Three layers could be distinguished: a monolayer in contact with the mercury surface exhibiting a methylene proton chemical shift of −4.1 ppm; a mesophase above the monolayer extending from the surface over a larger dimension and having a uniformly varying methylene proton chemical shift from −4.1 ppm to +1.2 ppm; an isotropic phase above the mesophase with the well-known isotropic chemical shift of 1.25 ppm for methylene protons in normal alkane chains. Representative NMR spectra and images of mercury dodecanethiolate films on macroscopic mercury surfaces are provided by the novel NMR detector 100 used for the investigations.

Sample analyses by nuclear magnetic resonance spectroscopy and imaging is one of the most powerful approaches available for the determination of chemical structures and molecular dynamics in a diversity of chemical and physical systems. The NMR Detector 100 for supported monolayer and multilayer films of the present invention is a new and useful analytical device for non-invasive spectroscopic and imaging investigations of the molecular architecture and dynamics of self-assembled monolayers (SAMs) and thin multilayer films.

Figure 1:
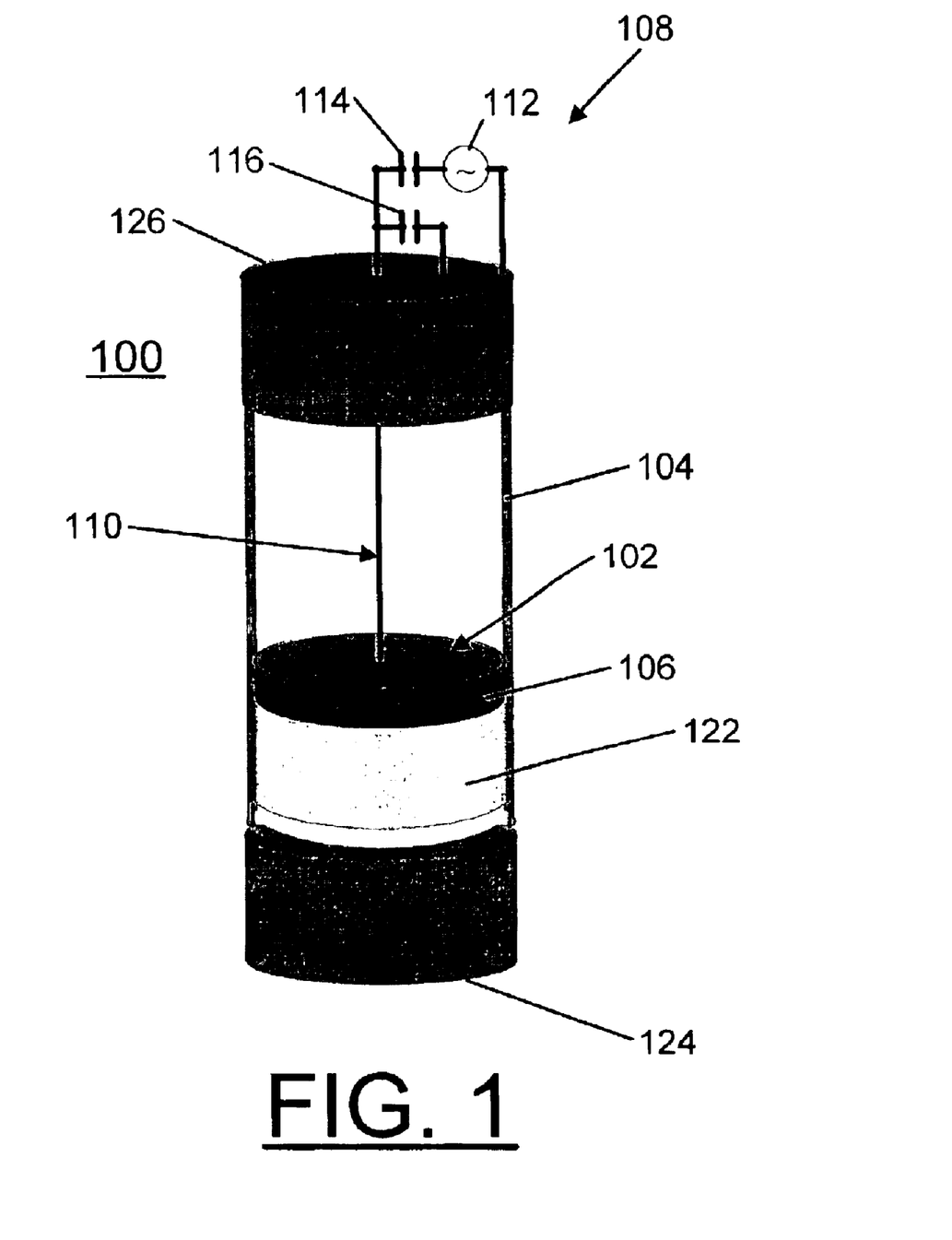
FIG. 1 is a schematic diagram illustrating an NMR detector of the preferred embodiment.

Referring to FIG. 1, NMR detector 100 includes a sample chamber 104 or a modified toroid cavity detector (TCD) 104, an atomically flat principal detector element 106 providing the atomically flat surface 102, and electronic components generally designated by reference character 108 that are used to tune the detector 100 to investigate different atomic nuclei. The modified toroid cavity detector (TCD) sample chamber 104 is formed, for example, of a stainless steel material. The modified toroid cavity detector (TCD) sample chamber 104 that operates in a transverse electromagnetic (TEM) wave mode contains a central conductor 110 that contacts a metal base of the cavity defined by the principal detector element 106. An RF signal is applied to the central conductor 110 from an RF source 112 via a matching capacitor 114 with a tuning capacitor 116 connected between the junction of matching capacitor 114 and the central conductor 110 and the stainless steel chamber 104.

An electrically insulating member or plug 122 formed of an electrically insulating material, such as Teflon® is contained in the modified toroid cavity detector (TCD) sample chamber 104. The electrically insulating plug 122 insulates the central conductor 110 from a base 124 of the cavity 104. The electrically insulating plug 122 supports the liquid mercury inductor 106. The central conductor 110 may be formed of an electrically conductive material, such as, stainless steel, copper or gold.

The principal detector element inductor 106 is formed by an atomically flat metallic disk, such as, a mercury pool, with a predefined surface area, such as a surface area of 7.5 cm$^2$. Liquid mercury is incorporated into a toroid cavity detector as the inductor of the resonance circuit, and as the base of the cavity. The pool or layer of mercury 106 activates the RF circuit by contacting the central conductor 110 to the wall of the cavity 104. The top of the central conductor 110 is insulated from a top 126 of the cavity 104 by an RF feed-through element (not shown).

The principal detector element inductor 106 can be formed by a selected one of various metals, alloys, and pure or doped semimetals. The principal detector element inductor 106 can be formed, for example, of gold, silver, gallium, platinum, and palladium.

The monolayer or multilayer films to be analyzed are composed of molecules that self-assemble to form a highly organized extended mesophase structure (a pseudo two-dimensional single crystal) on the surface 102 of the principal detector element 106. Conventional single and multi-dimensional NMR experiments used for elucidating atomic connectivities in large molecules, molecular conformations and orientations relative to the support surface normal, and types of molecular motions and frequencies can be employed to investigate nanothin films.

The variable tuning capacitor 116 is used to tune the toroid cavity NMR detector 100, for example, to 300 MHz (the nominal resonance frequency for protons in a magnetic field of 7 Tesla) and the fixed ceramic chip matching capacitor 114 couples the cavity to a transceiver with, for example, a 50 Ω output impedance. At least a section of the cavity 104 that contacts the mercury inductor 106 is formed from stainless steel to preclude alloy impurities. Mechanical vibrations of the cavity 104 during the acquisition of the NMR signal produce sinusoidal modulations in the NMR spectrum, but are easily avoided by known vibration isolation methods and devices. The quality factor of the cavity is nearly the same with mercury incorporated into the RF circuit (Q≧100). The 90° pulse is 2.2 μs for 50 Watts of RF power, and probe ring-down is over in ~4 μs. The surface area of the mercury pool is about 7.5 cm$^2$ or is a predefined surface area in a range from about 1 cm$^2$ to about 10 cm$^2$.

Figure 2:
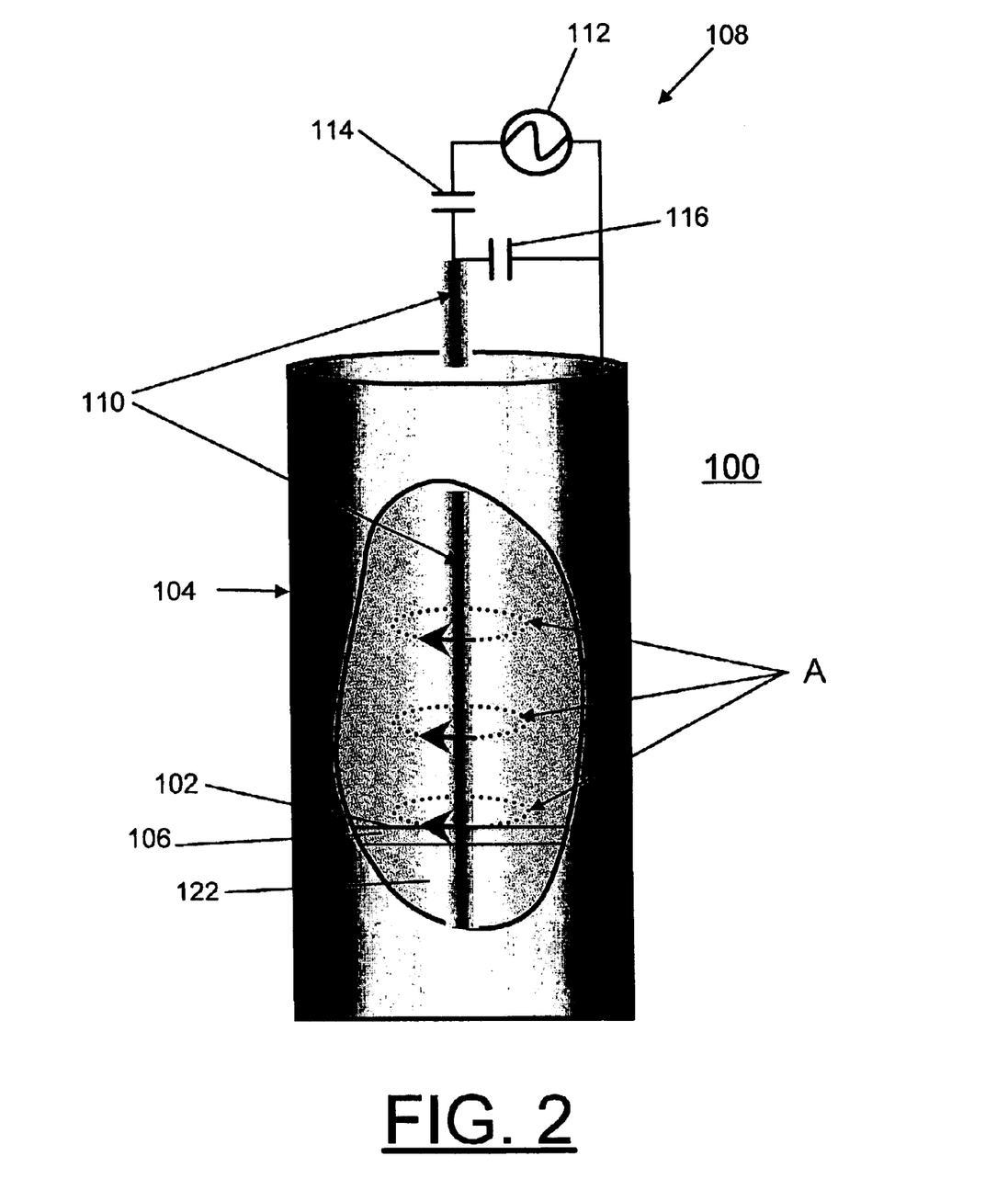
FIG. 2 is a diagram illustrating the NMR detector of FIG. 1 of the preferred embodiment with an RF magnetic field used for NMR analyses indicated by multiple circular arrows surrounding the central conductor.

FIG. 2 illustrates the NMR detector 100 of FIG. 1 of the preferred embodiment. In FIG. 2, multiple circular arrows labeled A surrounding the central conductor 110 within the cavity 104 indicate an RF magnetic field used for NMR analyses.

FIGS. 3, 4A, 4B, 5A, 5B, and 6 illustrate results obtained with the NMR detector of FIG. 1 of the preferred embodiment.

Figure 3:
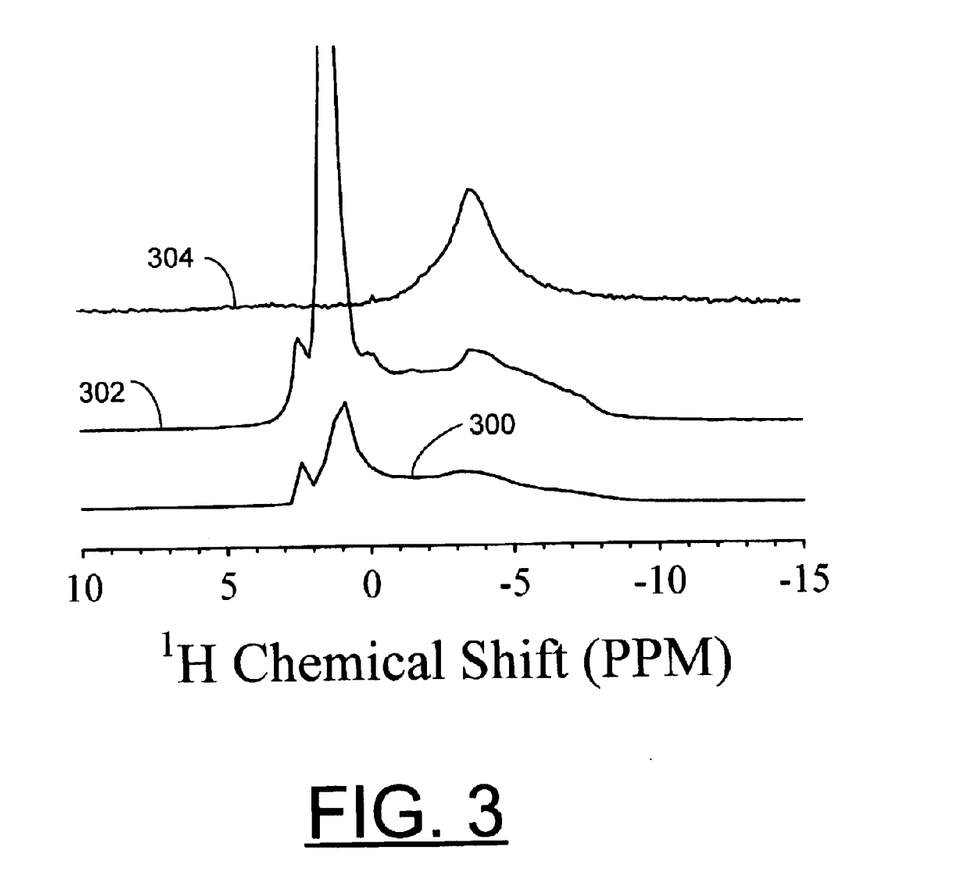
FIGS. 3, 4A, 4B, 5A, 5B, and 6 illustrate results obtained with the NMR detector of FIG. 1 of the preferred embodiment.

In FIG. 3, a line labeled 300 illustrates the deposition of neat butanethiol on the Hg surface 102. The NMR spectrum was recorded before complete vaporization of the excess thiol. The narrower peaks on the left side of FIG. 3 at line 300 correspond to the methylene protons of the excess butanethiol film. The broad peak is the thiolate monolayer and is the only peak remaining after evaporation of butanethiol. A line labeled 302 illustrates the deposition of neat dodecanethiol on the Hg surface 102. Dodecanethiol has a low vapor pressure and evaporates very slowly. A line labeled 304 illustrates the removal, by solvent washings, of the excess dodecanethiol in line 302 that results in only the broad peak at an anomalous chemical shift.

Figure 4A:
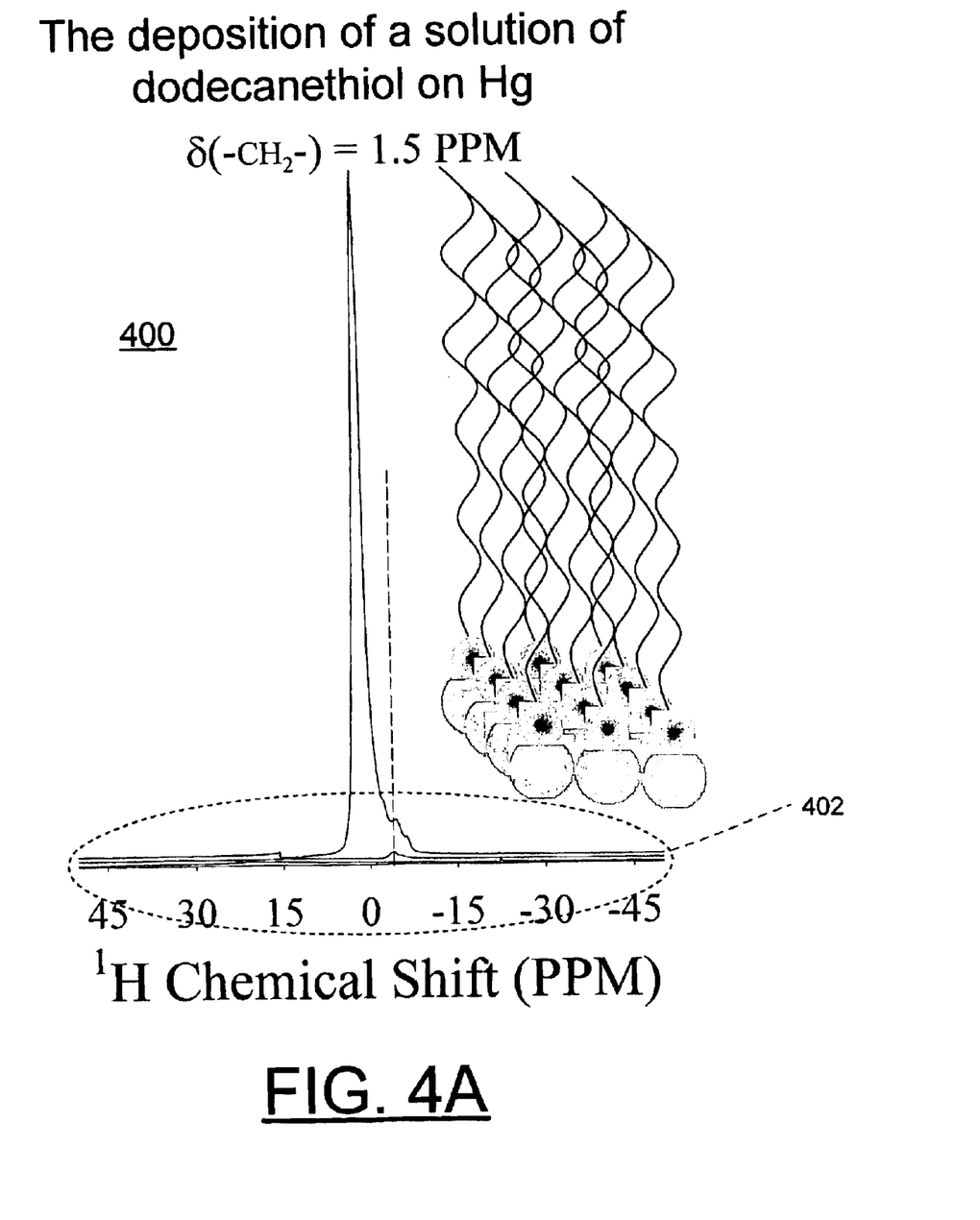
Figure 4B:
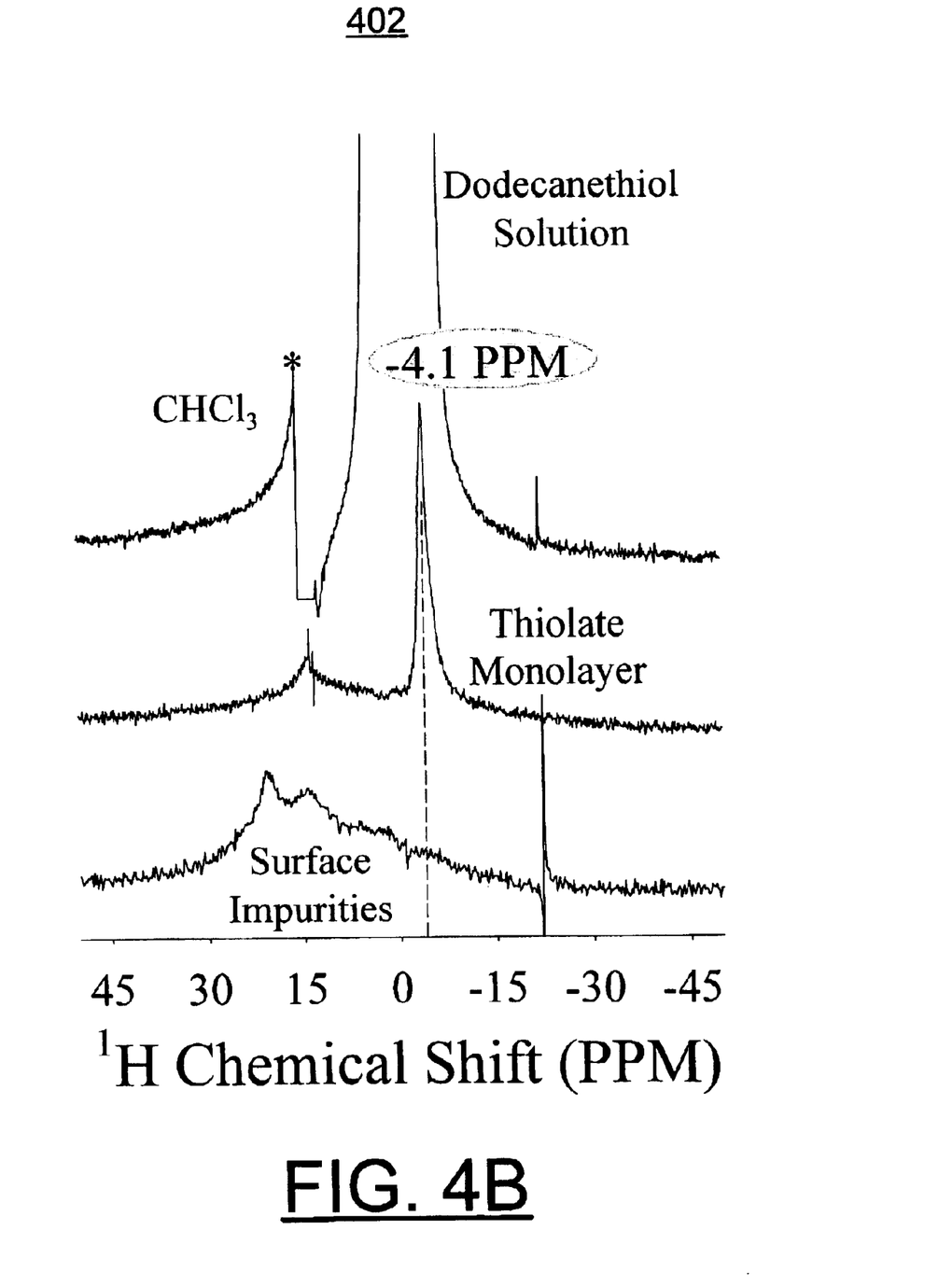

FIGS. 4A and 4B illustrate the deposition of a solution of dodecanethiol on the Hg surface 102. In FIG. 4A, the illustrated results of the deposition of a solution of dodecanethiol on the Hg surface 102 are generally designated by the reference character 400 with a lower portion indicated in dotted line labeled 402. In FIG. 4B, the portion 402 is shown enlarged.

Figure 5A:
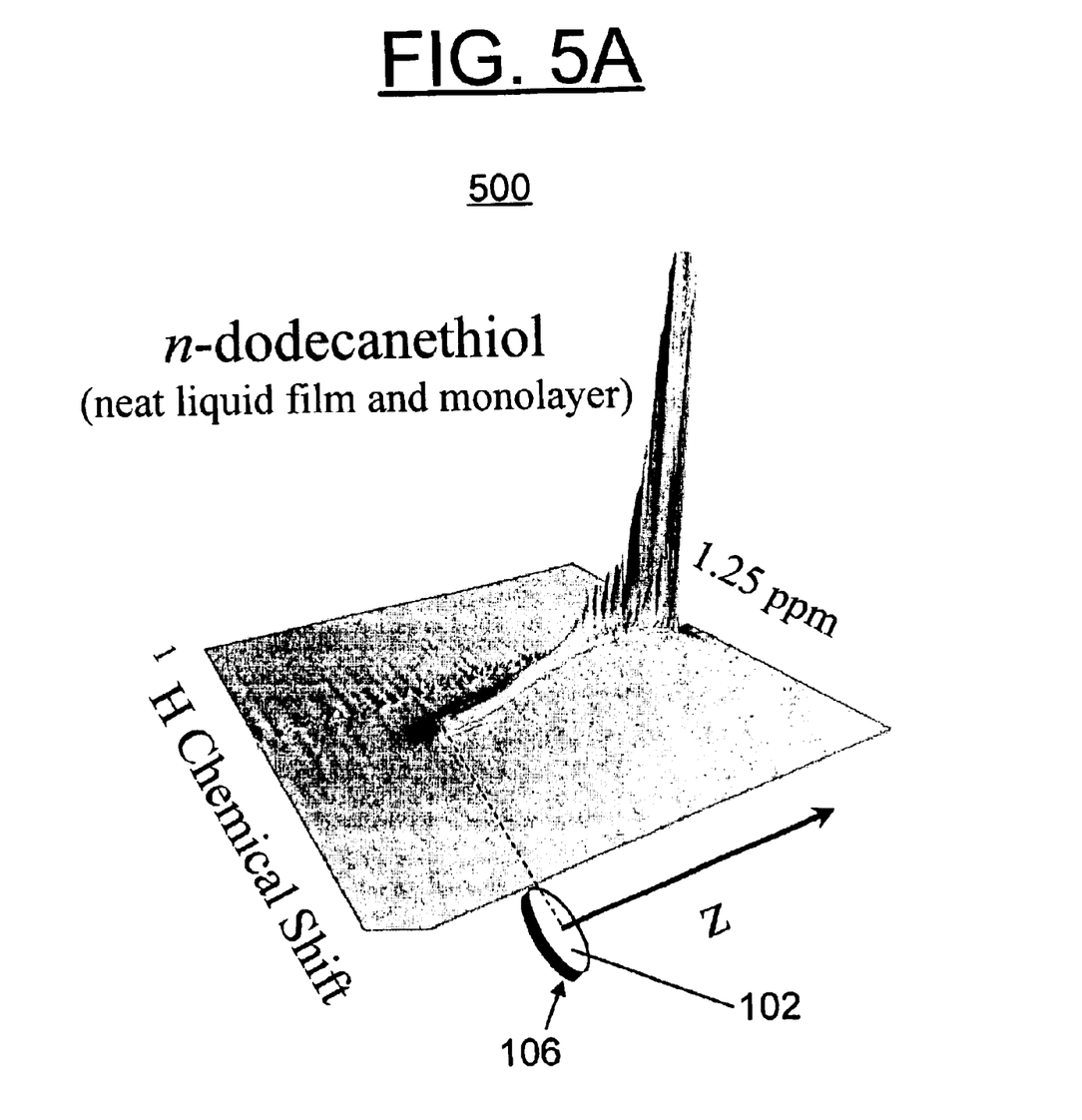
Figure 5B:
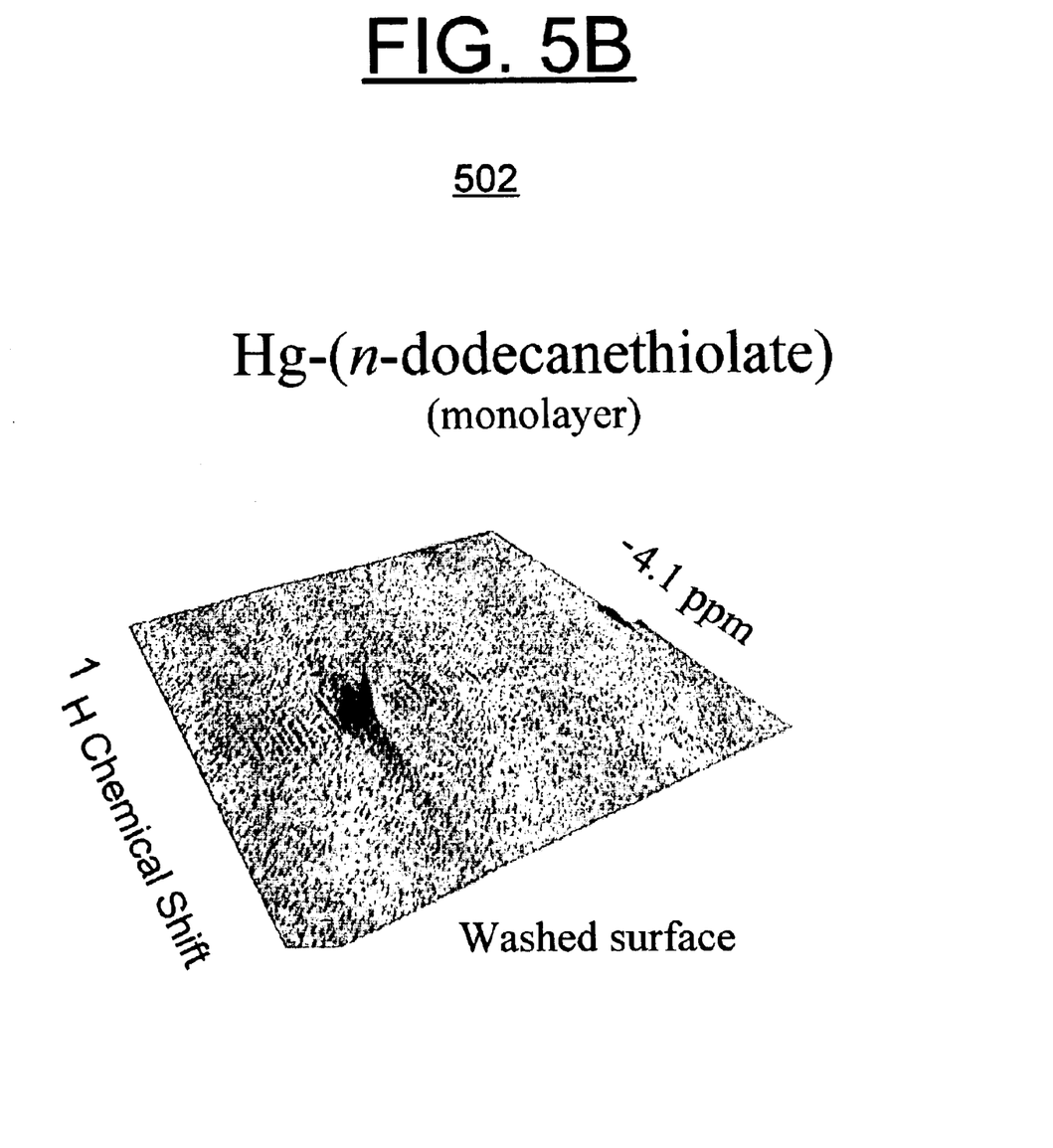

FIGS. 5A and 5B respectively illustrate two-dimensional (2-D) surface NMR for n-dodecanethiol (neat liquid film and monolayer) generally designated by the reference character 500 and Hg-(n-dodecanethiol) (monolayer) generally designated by the reference character 502. These surfaces were recorded using the rotating frame imaging method. Note the continuous change in the chemical shift of $(CH_2)_n$ from the neat n-dodecanethiol liquid to the n-dodecanethiolate monolayer. The monolayer may impose order on a thin film of Hg(II)bis(n-dodecanethiolate) bilayers.

Figure 6:
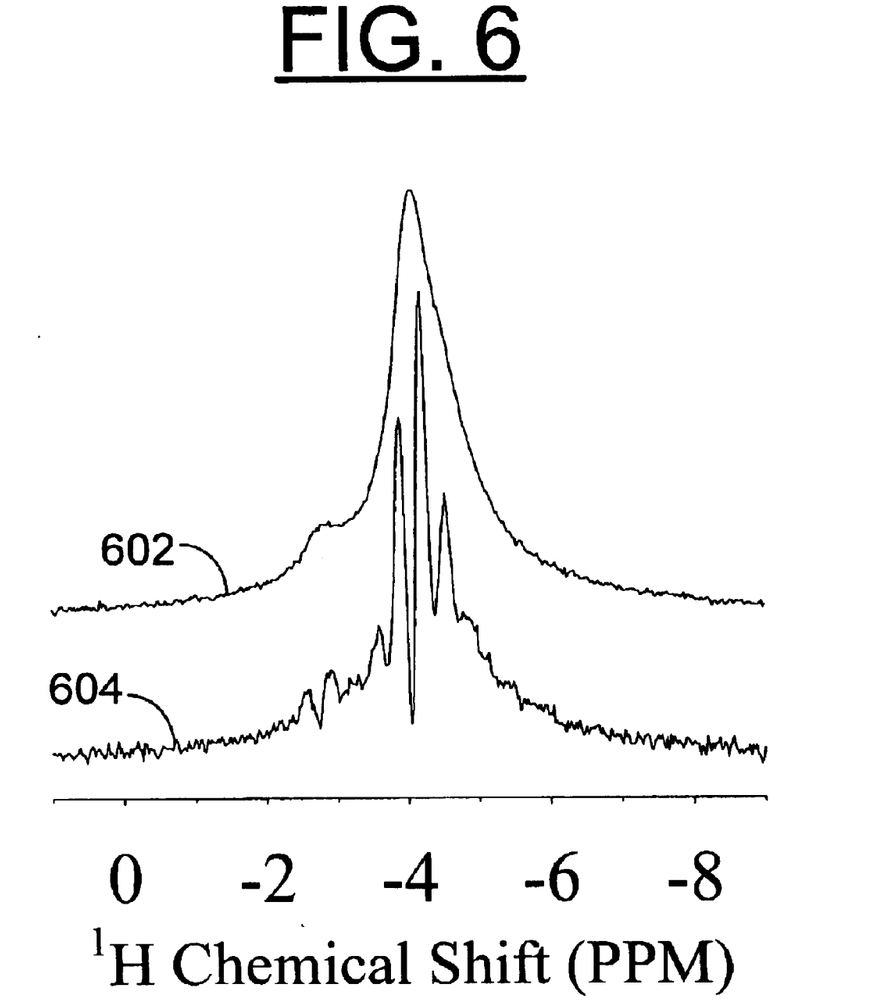

In FIG. 6, at a line 602 a broad anomalous peak at −4.1 ppm reveals a small shoulder downfield under conditions of higher $B_0$ homogeneity. The chemical shift difference between the two peaks is very similar to the isotropic chemical shift difference between the α-$CH_2$ and the >γ-$CH_2$ protons. A similar isotropic chemical shift difference should also manifest itself in a system with molecular order if all $CH_2$ groups are similarly oriented and other spin interactions are not dominant. Alternatively, the small shoulder peak may be due to the terminal $CH_3$ protons, and the larger peak to the $CH_2$ protons near the mobile end of the alkyl chain. At line 604, a hole-burning experiment demonstrates that the line broadening is inhomogeneous. A chemical shift dispersion can result from variations in the molecular orientation across the film surface, and inhomogeneity in $B_0$.

The novel NMR detector 100 of the invention provides for the first time the capability to record NMR spectra of self-assembled monolayers prepared on macroscopic and atomically flat surfaces. Significantly, the NMR spectra of these nanothick films characterize the atomic architecture and molecular dynamics of the component molecules with unprecedented detail. Traditional scattering techniques (such as X-ray reflectivity experiments) only elucidate the thickness of monolayer and multilayer films, and have not been able to specify details about the arrangement and motions of molecules that compose the films or of guest molecules that are embedded in the films. The novel NMR detector 100 of the invention comprises an RF circuit with an inductor defined by the atomically flat principal detector element 106 and a stainless steel sample chamber 104. The inductor is an atomically flat metallic disk or pool of liquid mercury having a predefined surface area, such as a surface area of 7.5 cm$^2$ or with a set surface area in a predefined range of 1 cm$^2$–10 cm$^2$. Liquid mercury metal is used as the first test substrate or the first metallic support because it is easily incorporated into a toroid cavity detector as the inductor and as the base of the cavity.

To test the invention self-assembled molecular structures, both mono-and multi-layers were formed using long-chain alkane thiols, which are known to chemically react with silver, gold, platinum, and mercury surfaces. One-dimensional H-1 NMR spectra reveal an anomalous chemical shift of −4.1 ppm for the methylene protons, and rotating frame images confirm that the NMR signal originates only from the surface of the metallic substrate. The NMR spectra of the alkane chain protons reveal an anomalous chemical shift of −4.1 ppm for the methylene protons, which typically resonate at +1.25 ppm in isotropic solutions. Imaging results also indicate that the bound mercury alkane thiolate monolayer may impart molecular order in a liquid phase composed of excess neat alkane thiol and located directly above the monolayer film. In addition, rotating frame images confirm that the NMR signal originates only from the surface of the metallic substrate. Imaging results also indicate that the bound mercury alkane thiolate monolayer may impart molecular order in a liquid phase composed of excess neat alkane thiol and located directly above the monolayer film. These experiments represent the first NMR spectroscopy data on supported highly ordered nanothick films of macroscopic dimensions, and demonstrate that the novel NMR detector 100 is functional.

Short and long chain n-alkyl thiols were deposited on an atomically flat surface detector made of mercury, and self-assembled to form mercury-thiolate monolayers. The molecular films comprised oriented alkane chains that had substantial translational motion in the plane of the mercury surface. The chemical shift anisotropy of the methylene protons, residual dipolar couplings, and intermolecular van der Waals forces are though to conspire to register distinct negative chemical shifts in H-1 NMR spectra and images. The anomalous peak positions should elucidate the translational dynamics of the thiolate molecules and the average orientation of the C—H bond direction with respect to the surface normal, which is parallel to the external magnetic field.

An experiment was successfully performed at room temperature on a highly ordered molecular film supported on a mercury surface. The results of the experiment demonstrated two important aspects of the invention: (a) a liquid metal inductor (mercury) with an atomically flat surface can be successfully incorporated into an RF resonance circuit as the inductor component; (b) a proton NMR spectrum of an alkanethiolate film can be recorded with good signal-to-noise ratio and reveals a frequency signature that indicates the conformation and orientation of the molecular axis with respect to the surface normal, and that the molecules possess significant in plane disorder and mobility.

Different mercaptans, $HSC_nH_{2n+1}$ n=4, 8, and 12, were deposited on a macroscopic and atomically flat mercury surface detector, and self-assemble to form mercury thiolate monolayers and mercuric bis(thiolate) bilayers. The molecular films comprise oriented alkane chains in the trans conformation and have two-dimensional in-plane disorder and translational motion on the mercury surface. One-dimensional $^1$H-NMR spectra reveal an anomalous peak at −4.1 ppm for the methylene protons, and images obtained by NMR confirm that the peak originates only from the surface of the metallic substrate. Imaging results also indicate that the bound mercury alkane thiolate monolayer may impart molecular order in a liquid phase (composed of excess neat mercaptan and mercuric bis(thiolate) bilayers) located directly above the monolayer film. The width of the anomalous peak provides a lower bound on the time-scale of the translational dynamics of the mercury thiolate molecules. The peak position indicates the average direction of the methylene C—H bonds with respect to the surface normal, which is parallel to the external magnetic field. Application of an electrochemical potential between an aqueous acid solution above the thiolate monolayer and the mercury electrode makes it possible to reduce and displace the monolayer in a controlled manner.

The critical issue of the anomalous resonance position for the proton signal at −4.1 ppm is not fully explained. The two primary interactions that affect the signal position are: (a) chemical shielding anisotropy (b) strong homonuclear spin-spin dipolar couplings. Several alternative interpretations of the $^1$H-NMR spectra and images are proposed, including the possibility that the observed spectra are due to physisorbed chloroform ($CHCl_3$), which was used as a solvent to deposit and wash the thin films. Relevant observations reported in the chemical literature on NMR spectroscopy of $CHCl_3$ guest molecules in liquid crystal hosts demand that the three-fold axis of $CHCl_3$ molecules interdigitated in the monolayers investigated here be approximately orthogonal to the molecular director axis of the host thiolate molecules. The large isotropic chemical shift (7.26 ppm) and the chemical shift anisotropy of the chloroform proton, due to the three electronegative chlorine atoms, make it possible for the observed proton resonance position to be accounted for by several orientations of the $CHCl_3$ molecular axis that are nominally perpendicular to the host's director axis. These possible orientations are in agreement with results described for $CHCl_3$ in the liquid crystal TBBA (terephthal-bis-(butylaniline)). However, the $^1$H-NMR images show a uniformly varying resonance position from −4.1 ppm to the well-known isotropic chemical shift of 1.25 ppm for methylene protons in normal alkane chains, and not the isotropic value of 7.26 ppm for $CHCl_3$. This conundrum and other possible explanations for the observed $^1$H-NMR spectra and images are being investigated.

Nuclear magnetic resonance (NMR) spectroscopy and imaging offer powerful methods for probing molecular structures and dynamics in oriented materials. The novel detector 100 is capable of recording proton NMR spectra of organic/inorganic hybrid structures one monolayer thick. Sufficient sensitivity is achieved by probing a contiguous monolayer of several square centimeters surface area. High-resolution proton NMR spectra recorded for a series of alkanethiol solutions, carefully prepared with quantitative amounts of solute molecules, were used to calibrate the sensitivity of a commercial NMR spectrometer. A quantity of $10^{17}$ molecules was observed with S/N>$10^2$ in a single scan using a commercial high-resolution $^1$H NMR probe. All proton chemical shifts and J-couplings were identified for dodecanethiol. A quantity of $10^{14}$ molecules (one monolayer equivalent per square centimeter on a metal surface) was observed with S/N ~3 for the terminal methyl group of dodecanethiol and a S/N ~15 for the methylene groups near the terminus of the dodecane chain. These data support the hypothesis that the anomalous proton spectrum observed for a dodecanethiol self-assembled monolayer on a mercury surface reveals only the methyl and methylene groups at or near the air/monolayer interface. At this interface methyl group rotation and alkyl group librations are sufficient to average intermolecular proton dipole-dipole interactions that lead to large spectral broadening. The dynamics of the α-, β-, and γ-$CH_2$ protons is constrained at the mercury/thiol interface so that the corresponding proton signals are homogeneously broadened and not observed. This interpretation is consistent with other spectroscopic observations that show substantial molecular dynamics of the terminal portion of alkane chains appended to metal surfaces.

While the present invention has been described with reference to the details of the embodiments of the invention shown in the drawing, these details are not intended to limit the scope of the invention as claimed in the appended claims.

What is claimed is:

1. An NMR detector comprising a radio frequency resonance circuit including a principal detector element and a chamber, said principal detector element defining an inductor of said resonance circuit, and said inductor being formed by an atomically flat metallic disk that includes a mercury pool.

2. An NMR detector as recited in claim 1 wherein said chamber includes a stainless steel sample chamber.

3. An NMR detector as recited in claim 1 wherein said mercury pool has a predefined surface area.

4. An NMR detector as recited in claim 2 wherein said predefined surface area includes a surface area in a range of approximately 1 $cm^2$ through 10 $cm^2$.

5. An NMR detector as recited in claim 2 wherein said predefined surface area includes a surface area of approximately 7.5 $cm^2$.

6. An NMR detector as recited in claim 1 wherein said chamber includes a modified toroid cavity detector (TCD).

7. An NMR detector as recited in claim 1 wherein said atomically flat metallic disk forming said inductor is contained within said chamber.

8. An NMR detector as recited in claim 1 wherein said atomically flat metallic disk forming said inductor is contained within a modified toroid cavity detector (TCD) defining said chamber.

9. An NMR detector as recited in claim 1 wherein said atomically flat metallic disk forming said inductor is formed by a selected one of a metal, an alloy, a pure semimetal, and a doped semimetal.

10. An NMR detector as recited in claim 1 wherein said atomically flat metallic disk forming said inductor is formed by a selected one of gold, silver, gallium, platinum, and palladium.

11. An NMR detector for detecting NMR spectra of a self-assembled molecular film comprising a radio frequency resonance circuit including a principal detector element and a sample chamber; said principal detector element defining an inductor of said resonance circuit; said inductor being formed by an atomically flat metallic disk contained within said chamber; and said inductor includes a mercury pool.

12. An NMR detector for detecting NMR spectra of a self-assembled molecular film as recited in claim 11 wherein said sample chamber includes a modified toroid cavity detector (TCD).

13. An NMR detector for detecting NMR spectra of a self-assembled molecular film as recited in claim 11 wherein said sample chamber includes a stainless steel sample chamber.

14. An NMR detector for detecting NMR spectra of a self-assembled molecular film as recited in claim 11 wherein said mercury pool inductor is supported by an electrically insulating member contained within said sample chamber.

15. An NMR detector for detecting NMR spectra of a self-assembled molecular film as recited in claim 14 includes a central conductor contained within said sample chamber and contacting said mercury pool inductor.

16. An NMR detector for detecting NMR spectra of a self-assembled molecular film as recited in claim 15 includes an RF source coupled to said central conductor; said sample chamber and said central conductor adapted to generate an RF magnetic field for NMR analysis.

17. An NMR detector for detecting NMR spectra of a self-assembled molecular film as recited in claim 16 includes a matching capacitor and a tuning capacitor coupled to said RF source.

18. An NMR detector for detecting NMR spectra of a self-assembled molecular film as recited in claim 11 wherein said inductor including said mercury pool has a predefined surface area.

19. An NMR detector for detecting NMR spectra of a self-assembled molecular film as recited in claim 18 wherein said inductor includes a surface area in a range of approximately 1 $cm^2$ through 10 $cm^2$.

20. An NMR detector for detecting NMR spectra of a self-assembled molecular film as recited in claim 11 wherein self-assembled molecular film is carried by said atomically flat metallic disk forming said inductor.

* * * * *